United States Patent
Verdeyen et al.

(10) Patent No.: US 6,741,944 B1
(45) Date of Patent: May 25, 2004

(54) ELECTRON DENSITY MEASUREMENT AND PLASMA PROCESS CONTROL SYSTEM USING A MICROWAVE OSCILLATOR LOCKED TO AN OPEN RESONATOR CONTAINING THE PLASMA

(75) Inventors: Joseph T. Verdeyen, Savoy, IL (US); Wayne L. Johnson, Phoenix, AZ (US); Murray D. Sirkis, Tempe, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/031,374

(22) PCT Filed: Jul. 20, 2000

(86) PCT No.: PCT/US00/19539
§ 371 (c)(1),
(2), (4) Date: May 22, 2002

(87) PCT Pub. No.: WO01/06402
PCT Pub. Date: Jan. 25, 2001

Related U.S. Application Data

(60) Provisional application No. 60/144,880, filed on Jul. 20, 1999.

(51) Int. Cl.[7] .................................................. H01S 3/13
(52) U.S. Cl. ........................... 702/76; 702/22; 702/31; 702/47; 702/108; 702/127; 702/189
(58) Field of Search ............................. 702/12, 22, 24, 702/31, 33, 47, 75, 76, 113, 127, 137, 189, 190, 194, FOR 107–108, FOR 115–119, FOR 124–125, FOR 128, FOR 134–135, FOR 143, FOR 155, FOR 157, FOR 170; 73/861.95; 324/682, 636; 315/111.21, 111.71

(56) References Cited

U.S. PATENT DOCUMENTS

| 2,405,229 A | 8/1946 | Mueller et al. |
|---|---|---|
| 2,483,189 A | 9/1949 | Eaglesfield |
| 2,735,941 A | 2/1956 | Peck |
| 2,971,153 A | 2/1961 | Wharton et al. |
| 3,265,967 A | 8/1966 | Heald |
| 3,290,614 A | 12/1966 | Racy |

(List continued on next page.)

FOREIGN PATENT DOCUMENTS

| EP | 0 432 573 | 6/1991 |
|---|---|---|
| WO | WO 01/06544 | 1/2001 |
| WO | WO 01/37306 | 5/2001 |

OTHER PUBLICATIONS

P. K. Atrey et al., "Measurement of chord averaged electron density in ADITYA using 100 GHz and 136 GHz interferometers", Indian J. Physics 66B (5 & 6), 1992, pp. 489–497.

(List continued on next page.)

*Primary Examiner*—Marc S. Hoff
*Assistant Examiner*—Carol S. W. Tsai
(74) *Attorney, Agent, or Firm*—Oblon, Spivak, McClelland, Maier & Neustadt, P.C.

(57) ABSTRACT

A system for measuring plasma electon densities (e.g., in the range of $10^{10}$ to $10^{12}$ cm$^{-3}$) and for controlling a plasma generator (240). Measurement of the plasma density is essential if plasma-assisted processes, such depositions or etches, are to be adequately controlled using a feedback control. Both the plasma measurement method and system generate a control voltage that in turn controls the plasma generator (240) to maintain the plasma electron density at a pre-selected value. The system utilizes a frequency stabilization system to lock the frequency of a local oscillator (100) to the resonant frequency of an open microwave resonator (245) when the resonant frequency changes due to the introduction of a plasma within the open resonator. The amplified output voltage of a second microwave discriminator may be used to control a plasma generator (240).

10 Claims, 9 Drawing Sheets

U.S. PATENT DOCUMENTS

| | | | |
|---|---|---|---|
| 3,383,509 A | 5/1968 | Goldstein et al. | |
| 3,388,327 A | 6/1968 | Sutton et al. | |
| 3,416,077 A | 12/1968 | Lacy | |
| 3,439,266 A | 4/1969 | Rogers | |
| 3,474,336 A | 10/1969 | Alford | |
| 3,490,037 A | 1/1970 | Williams | |
| 3,509,452 A | 4/1970 | Walker | |
| 3,572,948 A * | 3/1971 | Catherin | 356/434 |
| 3,599,089 A | 8/1971 | Bugnolo | |
| 3,699,475 A | 10/1972 | Rogers | |
| 3,899,752 A | 8/1975 | Engelmann | |
| 3,952,246 A | 4/1976 | Sprott et al. | |
| 3,956,695 A | 5/1976 | Stamm | |
| 4,034,312 A | 7/1977 | Armand | |
| 4,096,453 A | 6/1978 | Rogers | |
| 4,354,166 A * | 10/1982 | Grudkowski | 331/107 A |
| 4,410,992 A * | 10/1983 | Javan | 372/32 |
| 4,540,955 A | 9/1985 | Fiedziuszko | |
| 4,775,845 A | 10/1988 | McCoy | |
| 4,888,554 A * | 12/1989 | Hyde et al. | 324/316 |
| 4,899,100 A | 2/1990 | Talanker et al. | |
| 4,944,211 A | 7/1990 | Rowan et al. | |
| 4,949,053 A | 8/1990 | Havens | |
| 5,012,212 A * | 4/1991 | Matsui et al. | 333/227 |
| 5,082,517 A | 1/1992 | Moslehi | |
| 5,245,405 A * | 9/1993 | Mitchell et al. | 356/301 |
| 5,304,282 A * | 4/1994 | Flamm | 216/68 |
| 5,383,019 A * | 1/1995 | Farrell et al. | 356/316 |
| 5,455,565 A * | 10/1995 | Moeenziai et al. | 340/603 |
| 5,506,475 A | 4/1996 | Alton | |
| 5,568,801 A | 10/1996 | Paterson et al. | |
| 5,621,331 A | 4/1997 | Smith et al. | |
| 5,691,642 A | 11/1997 | Dobkin | |
| 5,804,033 A * | 9/1998 | Kanai et al. | 216/69 |
| 5,826,458 A * | 10/1998 | Little | 73/73 |
| 5,907,820 A | 5/1999 | Pan | |
| 5,936,413 A * | 8/1999 | Booth et al. | 324/678 |
| 5,939,886 A | 8/1999 | Turner et al. | |
| 5,945,888 A * | 8/1999 | Weinert et al. | 333/17.1 |
| 6,027,601 A | 2/2000 | Hanawa | |
| 6,074,568 A | 6/2000 | Adachi et al. | |
| 6,163,328 A * | 12/2000 | Vannerson et al. | 347/128 |
| 6,260,408 B1 * | 7/2001 | Vig et al. | 73/64.53 |
| 6,339,297 B1 * | 1/2002 | Sugai et al. | 315/111.21 |
| 2002/0125223 A1 * | 9/2002 | Johnson et al. | 219/121.43 |

OTHER PUBLICATIONS

D. Bora et al., "Plasma density measurement using a simple microwave technique", Rev. Sci. Instrum. 59 (10), Oct. 1988, pp. 2149–51.

D. Bora et al., "A simple microwave technique for plasma density measurement using frequency modulation", Plasma Physics and Controlled Fusion 26 (7), 1984, pp. 853–857.

Nils Brenning, "An improved microwave interferometer technique for plasma density measurements: II", J. Phys. E: Sci. Istrum. 21, 1988, pp. 578–582.

N. Brenning, "An improved microwave interferometer technique for plasma density measurements", J. Phys. E: Sci. Instrum. 17, 1984, pp. 1018–1023.

M. A. G. Calderon et al., "Experimental study of a swept reflectometer with a single antenna for plasma density profile measurement", International Journal of Infrared and Millimeter Waves 6 (7), 1985, pp. 605–628.

G. D. Conway et al., "Plasma density fluctuation measurements from coherent and incoherent microwave reflection", Plasma Phys. Control. Fusion 38, 1996, pp. 451–466.

P. C. Efthimion et al., "1–millimeter wave interferometer for the measurement of line integral electron density on TFTR", Rev. Sci. Instrum. 56 (5), May 1985, pp. 908–910.

J. A. Fessey et al., "Plasma electron density measurements from the JET 2 mm wave interferometer", J. Phys. E: Sci. Instrum. 20, 1987, pp. 169–174.

H. Kumar et al., "Measurements of plasma density in argon discharge by Langmuir probe & microwave interferometer", Indian Journal of Pure & Applied Physics 17, May 1979, pp. 316–318.

G. Neumann et al., "Plasma–density measurements by microwave interferometry and Langmuir probes in an rf discharge", Rev. Sci. Instrum. 64 (1), Jan. 1993, pp. 19–25.

Lawrence J. Overzet et al., "Comparison of electron–density measurements made using a Langmuir prove and microwave interferometer in the Gaseous Electronics Conference reference reactor", J. Appl. Phys. 74 (7), Oct. 01, 1993, pp. 4323–4330.

John A. Thornton, "Diagnostic methods for sputtering plasmas", J. Vac. Sci. Technol. 15 (2), Mar./Apr. 1978, pp. 188–192.

J. R. Wallington et al., "A sensitive microwave interferometer for plasma diagnostics", J. Plasma Physics 3 (part 3), 1969, pp. 371–375.

M. Haverlag et al., "Measurements of negative ion densities in 13.56–MHz rf plasmas of $CF_4$, $C_2F_6$, $CHF_3F_8$ using microwave resonance and the photodetachment effect", J. Appl. Phys. 70 (7), Oct. 01, 1991, pp. 3472–3480.

M. Haverlag et al., "Negatively charged particles in fluorocarbon rf etch plasmas: Density measurements using microwave resonance and the photodetachment effect", Materials Science Forum, vol. 140–142, 1993, pp. 235–254.

G. R. Hanson et al., "Density fluctuation measurements in ATF using correlation reflectrometry", Nuclear Fusion 32 (9), 1992, pp. 1593–1608.

G. R. Hanson et al., "A swept two–frequency microwave reflectometer for edge density profile measurements on TFTR", Rev. Sci. Instrum. 63 (10), Oct. 1992, pp. 4658–4660.

K. W. Kim et al., "Development of a fast solid–state high––resolution density profile reflectometer system on the DIII–D tokamak", Rev. Sci. Instrum. 68 (1), Jan. 1997, pp. 466–469.

P. Millot et al., "An advanced radar technique for electron density measurements on large tokamaks", Eighteenth International Conference on Infrared and Millimeter Waves, James R. Birch, Terence J. Parker, Editors, Proc. SPIE 2104, 1993, pp. 240–241.

Masaaki Nagatsu et al., "Application of maximum entropy method to density profile measurement via microwave reflectrometry on GAMMA 10", Plasma Phys. Control. Fusion 38, 1996, pp. 1033–1042.

R. Nazikian et al., "Reflectometer measurements of density fluctuations in tokamak plasmas (invited)", Rev. Sci. Instrum. 66 (1), Jan. 1995, pp. 392–398.

L. J. Overzet et al., "Enhancement of the plasma density and deposition rate in rf discharges", Appl. Phys. Lett. 48 (11), Mar. 17, 1986, pp. 695–697.

R. Schubert, "Sensor for plasma density profile measurement in magnetic fusion machine", Sensors and Actuators A 41–42, 1994, pp. 53–57.

S. Shammas et al., "Simplified microwave measurement of uv photoplasmas", J. Appl. Phys. 51 (4), Apr. 1980, pp. 1970–1974.

A. C. C. Sips et al., "Analysis of reflectometry density profile measurements in JET", Plasma Phys. Control. Fusion 35, 1993, pp. 743–755.

W. Hess et al., "A new 17 . . . 23 GHz cavity stabilized, hermetically sealed module VCO in chip technique", Conference proceedings of the 22nd European Microwave Conference, vol. 1, Aug. 24–27, 1992, pp. 143–148. INSPEC abstract No. B9211–1350H–047.

H. Flugel et al., "Cavity stabilisation techniques for harmonic–mode oscillators", Proceedings of the eighth colloquium on microwave communication, Aug. 25–29, 1986, pp. 393–394. INSPEC abstract No. B88050407.

Helmut Barth, "A high Q cavity stabilized Gunn oscillator at 94 GHz", 1986 IEEE MTT–S International Microwave Symposium Digest, Jun. 2–4, 1986, pp. 179–182. INSPEC abstract No. B87006105.

P. M. Marshall et al., "Simple technique cavity–stabilizes VCO", Microwaves & RF 24 (7), Jul. 1985, pp. 89–92. INSPEC abstract No. B86014481.

M. E. Znojkiewicz, "8 GHz low noise bias tuned VCO", 1984 IEEE MTT–S International Microwave Symposium Digest, May 29–Jun. 1, 1984, pp. 489–491. INSPEC abstract No. B85017875.

A. Jacob et al., "Optimum design of cavity stabilized FET oscillators", Conference Proceedings of the 13th European Microwave Conference, Sep. 5–8, 1983, pp. 509–514. INSPEC abstract No. B84009181.

Brian E. Rose, "10 GHz cavity stabilized FET oscillator", Proceedings of the 32nd Annual Frequency Control Symposium, May 31–Jun. 2, 1978, pp. 385–388. INSPEC abstract No. B79030122.

Klaus Schunemann et al., "On the matching of transmission cavity stabilized microwave oscillators", IEEE transactions on microwave theory and techniques MTT–26 (3), Mar. 1978, pp. 147–155. INSPEC abstract No. B78028026.

Brian Owen, "Mechanically tuneable, cavity–stabilized millimeter–wave IMPATT oscillators", 1977 IEEE MTT–S International Microwave Symposium Digest, 1977, pp. 22–25. INSPEC abstract No. B78005511.

Walter R. Day, "Frequency modulation of cavity stabilized solid state diode oscillators", 1973 IEEE–G–MTT International Microwave Symposium Digest of Technical Papers, Jun. 4–6, 1973, pp. 247–249. INSPEC abstract No. B74005473.

J. Clarke, "A simple stabilized microwave source", IEEE Transactions on Instrument and Measurement, vol. IM–21 (1), Feb. 1972, pp. 83–84. INSPEC abstract No. B72013995.

David I. C. Pearson et al., "A microwave interferometer for density measurement and stabilization in process plasmas", Materials Research Society Symposium Proceedings 117, Apr. 5–7, 1988, pp. 311–317.

M. Manso et al., "Localized density measurements on ASDEX using microwave reflectometry", Max–Planck–Institut Plasmaphysik Technical Report IPP III/164, Paper No. R1, Sep. 1990, 4 pages.

A. Silva et al., "First density measurements with microwave reflectometry on ASDEX upgrade", Max–Planck–Institut Plasmaphysik Technical Report IPP 1/277, Oct. 1993, pp. 154–157.

Kai Chang, "Millimeter–wave spatial and quasi–optical power combining technqiues", International conference on millimeter waves and far–infrared technology conference digest (Cat. No. 89TH0257–6), 1989, pp. 431–434.

Jin–Bang Tang et al., "Finite element analysis of the dielectric resonator", International conference on millimeter waves and far–infrared technology conference digest (Cat. No. 89TH0257–6), 1989, pp. 435–438.

I. V. Altukhov et al., "Far infared radiation from uniaxially compresed p–type GE", International conference on millimeter waves and far–infrared technology conference digest (Cat. No. 89TH0257–6), 1989, pp. 439–442.

Fu–Jiang Liao et al., "Developing status of millimeter wave tubes in China", International conference on millimeter waves and far–infrared technology conference digest (Cat. No. 89TH0257–6), 1989, pp. 443–446.

Li–Rong Jin et al., "D–band silicon IMPATT diode", International conference on millimeter waves and far–infrared technology conference digest (Cat. No. 89TH0257–6), pp. 447–449.

Sheng–Min Liu et al., "The millimeter wave Gunn oscillator and self–oscillating mixer using the nonradiative dielectric waveguide", International conference on millimeter waves and far–infrared technology conference digest (Cat. No. 89TH0257–6), 1989, pp. 450–452.

Wei Hong et al., "Study on broadband millimeter wave oscillators", International conference on millimeter waves and far–infrared technology conference digest (Cat. No. 89TH0257–6, 1989, pp. 453–456.

Dunfu Li et al., "Influence of moisture on cavity–stabilized oscillators", International conference on millimeter waves and far–infrared technology conference digest (Cat. No. 89TH0257–6), 1989, pp. 457–460.

D. Ni et al., "Millimeter–wave generation and characterization of a GaAs FET by optical mixing", International conference on millimeter waves and far–infrared technology conference digest (Cat. No. 89TH0257–6), 1989, p. 493.

Jing–Feng Miao et al., "New NRD guide oscillator", International conference on millimeter waves and far–infrared technology conference digest (Cat. No. 89TH0257–6), 1989, pp. 494–496.

Yu–Fen Yang et al., "8mm pulse IMPATT oscillators", International conference on millimeter waves and far–infrared technology conference digest (Cat. No. 89TH0257–6), 1989, pp. 497–499.

Ning Chen et al., "Novel large signal mathematical model of mm–wave Gunn device", International conference on millimeter waves and far–infrared technology conference digest (Cat. No. 89TH0257–6), 1989, pp. 500–502.

Wang Dongjin et al., "VCO for millimeter–wave phase––locked sources", International conference on millimeter waves and far–infrared technology conference digest (Cat. No. 89TH0257–6), 1989, pp. 503–505.

Wang Dongjin, "A new viewpoint on the operation principles of the reflection type cavity–stabilized Gunn oscillator", International conference on millimeter waves and far–infrared technology conference digest (Cat. No. 89TH0257–6), 1989, pp. 506–509.

S. P. Kuo et al., "Operation of a sixteenth harmonic cusptron oscillator", International conference on millimeter waves and far–infrared technology conference digest (Cat. No. 89TH0257–6), 1989, pp. 510–513.

Igor Alexeff et al., "Recent developments in the Orbitron MASER", International conference on millimeter waves and far–infrared technology conference digest (Cat. No. 89TH0257–6), 1989, pp. 583–587.

V. K. Malyutenko et al., "Thermal–emitting diodes for IR", International conference on millimeter waves and far–infrared technology conference digest (Cat. No. 89TH0257–6), 1989, pp. 588–590.

Valentin M. Feru et al., "An absolute radiometric evaluation of the special irradiance created by the optical radiation sources", International conference on millimeter waves and far–infrared technology conference digest (Cat. No. 89TH0257–6), 1989, p. 591.

V. I. Gavrilenko et al., "Negative cyclotron mass MASER—A new type of semiconductor generator for millimeter and submillimeter wave range", International conference on millimeter waves and far–infrared technology conference digest (Cat. No. 89TH0157–6), 1989, pp. 592–596.

E. V. Beregulin et al., "Saturation absorption of the IR–FIR radiation in semiconductors and its technical utilization", International conference on millimeter waves and far–infrared technology conference digest (Cat. No. 89TH0257–6), 1989, pp. 597–600.

I. E. Aronov et al., "Radiowave excitation of resonant D. C. electromotive force in metals", International conference on millimeter waves and far–infrared technology conference digest (Cat. No. 89TH0257–6), 1989, p. 601.

M. V. Burtyka et al., "Instability of electromagnetic oscillations of the millimeter wave range specified by injection of charge carrier in inhomogeneous semiconductor structures", International conference on millimeter waves and far–infrared technology conference digest (Cat. No. 89TH0257–6), 1989, pp. 602–605.

Li Dunfu et al., "Stability condition for 8mm phase–locked source", International conference on millimeter waves and far–infrared technology conference digest (Cat. No. 89TH0257–6), 1989, pp. 606–609.

Wanjun Bi et al., "Experimental study of an overmode power combiner of 8mm IMPATT diodes", International conference on millimeter waves and far–infrared technology conference digest (Cat. No. 89TH0257–6), 1989, pp. 610–613.

Hua–fang Zhang et al., "Varactor–tuned Ka–band Gunn oscillator", International conference on millimeter waves and far–infrared technology conference digest (Cat. No. 89TH0257–6), 1989, pp. 614–616.

A. A. Lavrinovich, "7mm traveling–wave MASER with gain bandwidth exceeding 200 MHz", International conference on millimeter waves and far–infrared technology conference digest (Cat. No. 89TH0257–6), 1989, pp. 617–618.

* cited by examiner

ELECTRON DENSITY MEASUREMENT AND PLASMA PROCESS CONTROL SYSTEM USING A MICROWAVE OSCILLATOR LOCKED TO AN OPEN RESONATOR CONTAINING THE PLASMA

CROSS-REFERENCE TO RELATED APPLICATIONS

This application claims the benefit of Provisional application Ser. No. 60/144,880, filed Jul. 20, 1999.

The present application is related to co-pending applications entitled "ELECTRON DENSITY MEASUREMENT AND CONTROL SYSTEM USING PLASMA-INDUCED CHANGES IN THE FREQUENCY OF A MICROWAVE OSCILLATOR," Ser. No. 60/144,878 and "ELECTRON DENSITY MEASUREMENT AND PLASMA PROCESS CONTROL SYSTEM USING CHANGES IN THE RESONANT FREQUENCY OF AN OPEN RESONATOR CONTAINING THE PLASMA," Ser. No. 60/144,833 both of which have been filed concurrently herewith. Both of those applications are herein incorporated by reference in their entirety.

BACKGROUND OF THE INVENTION

1. Field of the Invention

The present invention provides a method and system for measuring electron densities in a plasma processing system, such as is used in semiconductor processing systems.

2. Description of the Background

Following the Second World War, several university research groups used microwave technology that had been developed during the war to study partially ionized gases. In particular, Professor Sanborn C. Brown's group at Massachusetts Institute of Technology developed and exploited the so-called "cavity technique" for the measurement of electron density in partially ionized, electrically quasi-neutral gases, which have come to be called plasmas.

In this procedure, changes in the resonant behavior of a microwave cavity were studied as a consequence of the presence of a plasma within it. Typically, a right, circularly cylindrical cavity operating in its lowest or nearly lowest order resonant mode was used, and the gas was contained within a coaxial Pyrex™ or quartz tube. An aperture was provided in each planar end surface to permit passage of the tube through the cavity.

The presence of a plasma within a microwave cavity will, in general, affect both the resonant frequency of a particular cavity mode and the sharpness (Q) of the resonance; i.e., the precision with which the frequency of a microwave signal must be fixed if the resonant mode is to be appreciably excited. Using a form of perturbation theory, it is possible to relate the changes in these parameters to the electron density and the electron collision frequency in the plasma. The perturbation theory is valid only for (radian) frequencies $\omega$ that satisfy the condition:

$$\omega^2 >> \omega_p^2 = 3.18 \times 10^9 N_e$$

where $\omega_p$ is the plasma (radian) frequency, and $N_e$ is the electron density in electrons/cm$^3$. Consequently, for the diagnosis of plasmas with electron densities of the order of $10^{12}$ cm$^{-3}$, the magnitudes of interest here, a microwave signal frequency ($\omega/2\Pi$) in excess of tens of GHz is required.

The requirement of signal frequencies on the order of tens of GHz causes a significant problem. The physical dimensions of a cavity designed to resonate in its lowest or nearly lowest order resonant mode are on the order of the wavelength of the signal. Thus, a cavity designed to resonate at about 35 GHz has dimensions on the order of only a centimeter. The use of such a small cavity for electron density measurements is difficult.

In principle it is possible to use a cavity designed to resonate in a "higher order" mode to overcome the problem associated with the small physical size of a lowest or low order mode. However, if this approach is taken, it becomes extremely difficult to know with certainty the identity of a particular excited cavity mode. Consequently, it becomes practically very difficult, if not impossible, to apply perturbation theory to determine the electron density and the electron collision frequency.

One way to circumvent this problem is to use an "open" resonator, i.e., a resonator in which the electromagnetic field is not confined by a (nearly) completely enclosing conducting surface. A practical example of an open resonator is a pair of large aperture, circularly symmetrical end mirrors, with planar or curved surfaces and with no confining circularly symmetrical conducting surface between them. Open resonators of this type were considered in great detail by A. G. Fox and T. Li in "Resonant modes in a MASER interferometer," *Bell System Technical Journal*, vol. 40, pp. 453–488, March 1961. They showed that any mode that could be regarded as including a plane wave component propagating at a significant angle with respect to the axis of symmetry would not be appreciably excited, i.e., would have a very low Q. In effect, for an open resonator, the number of practically useful modes with resonant frequencies in a particular frequency range is far less than the equivalent number for a closed resonator of similar size. This property of open resonators provided an enormous opportunity for researchers to extend resonant plasma diagnostic techniques to frequencies above 35 GHz.

Microwave energy may be coupled from a waveguide feed to an open resonator using the same principles that govern coupling from a waveguide feed to a closed resonator. The location, spatial rotation, and size of a coupling aperture in a resonator mirror has to be appropriately related to the configuration of the electromagnetic field for the desired resonator mode. The input and output coupling apertures may both be on the same mirror or the input aperture may be on one mirror and the output aperture on the other.

Known electronically tunable microwave oscillators are frequency stabilized with the aid of a resonant cavity and a microwave discriminator. The basic concepts are documented in detail in various M.I.T. Radiation Laboratory Reports and in the Radiation Laboratory Series published by McGraw-Hill in 1947. One use of those oscillators is to cause an electronically tunable oscillator to track the resonant frequency of a microwave resonator as that frequency is changed. An extensive discussion of the techniques is presented in Vol. 11, Technique of Microwave Measurements, M.I.T. Radiation Laboratory Series, Carol H. Montgomery, Editor, McGraw-Hill Book Company, New York, 1947, pp. 58–78 (hereinafter "Montgomery"). The entire contents of Montgomery are hereby incorporated by reference. A block diagram for a stabilization circuit 102 is shown in FIG. 1. FIG. 1 is similar to FIG. 2.29 on page 60 of Montgomery. The use of a microwave interferometer is also described in two known publications: (1) "A Microwave Interferometer for Density Measurement Stabilization in Process Plasmas," by Pearson et al., Materials Research Society Symposium Proceedings, Vol. 117 (Eds. Hays et al.), 1988, pgs. 311–317, and (2) "1-millimeter wave interferometer for the measurement of line integral electron density on TFTR," by Efthimion et al., Rev. Sci. Instrum. 56 (5), May 1985, pgs. 908–910.

When the frequency of the oscillator 100 differs from the resonant frequency of the microwave cavity 105, a signal is produced by the discriminator 110. The output of the discriminator 110 is amplified by an amplifier 115. The amplified discriminator signal 120 is then fed to the oscillator 100 with the polarity required to move the frequency of the oscillator 100 toward the resonant frequency of the microwave cavity 105.

If the frequency of the oscillator 100 is locked to the resonant frequency of the microwave cavity 105 using the stabilization circuit 102, tuning the microwave cavity 105 will cause the oscillator 100 to track the resonant frequency within a range that will be limited by the electronic tuning capability of the amplifier 115 and the frequency sensitivity of the ancillary microwave circuitry. Page 69 of Montgomery discloses a tunable oscillator.

As shown in FIG. 1, the major components of the stabilization system 102 are the microwave discriminator 110 and the amplifier 115. Two configurations for the discriminator 110 exist. FIG. 2 shows a first embodiment of the discriminator 110 that includes a directional coupler 150 and a bridge 160 (also known as a magic Tee). The bridge 160 compares the signal reflected by a short-circuited waveguide 165 of length x with the signal reflected from the microwave cavity 105 fed by a line 175 of length x–$\lambda_g$/8, where $\lambda_g$ is the guide wavelength. The microwave signal enters the bridge 160 at arm 180 (the H-plane arm) through the directional coupler 150. The arm of the directional coupler 150 is the input to the discriminator from the microwave oscillator 100. At the Tee junction 185 of the bridge 160, waves of equal amplitude and phase traveling away from the junction are excited in the short-circuited waveguide 165 and the line 175 (collectively called the S arms).

In the second embodiment, the microwave discriminator 110 may also be realized by replacing the directional coupler 150 with a second magic Tee. This is not surprising since a magic Tee is equivalent to a 3 dB directional coupler. Thus, the analyses are similar and will not be considered further herein.

SUMMARY OF THE INVENTION

It is an object of the present invention to provide an improved plasma electron density measurement and control system using a microwave oscillator locked to an open resonator containing a plasma.

It is another object of the present invention to provide a robust control of the plasma electron density by tracking to another resonant mode when the oscillator loses its lock on one resonant mode.

These and other objects of the present invention are achieved by using a frequency stabilization system to lock the frequency of a local oscillator to a pre-selected resonant frequency of an open microwave resonator when the resonant frequency changes due to the introduction of a plasma within the open resonator.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE PREFERRED EMBODIMENTS

Figure 2:
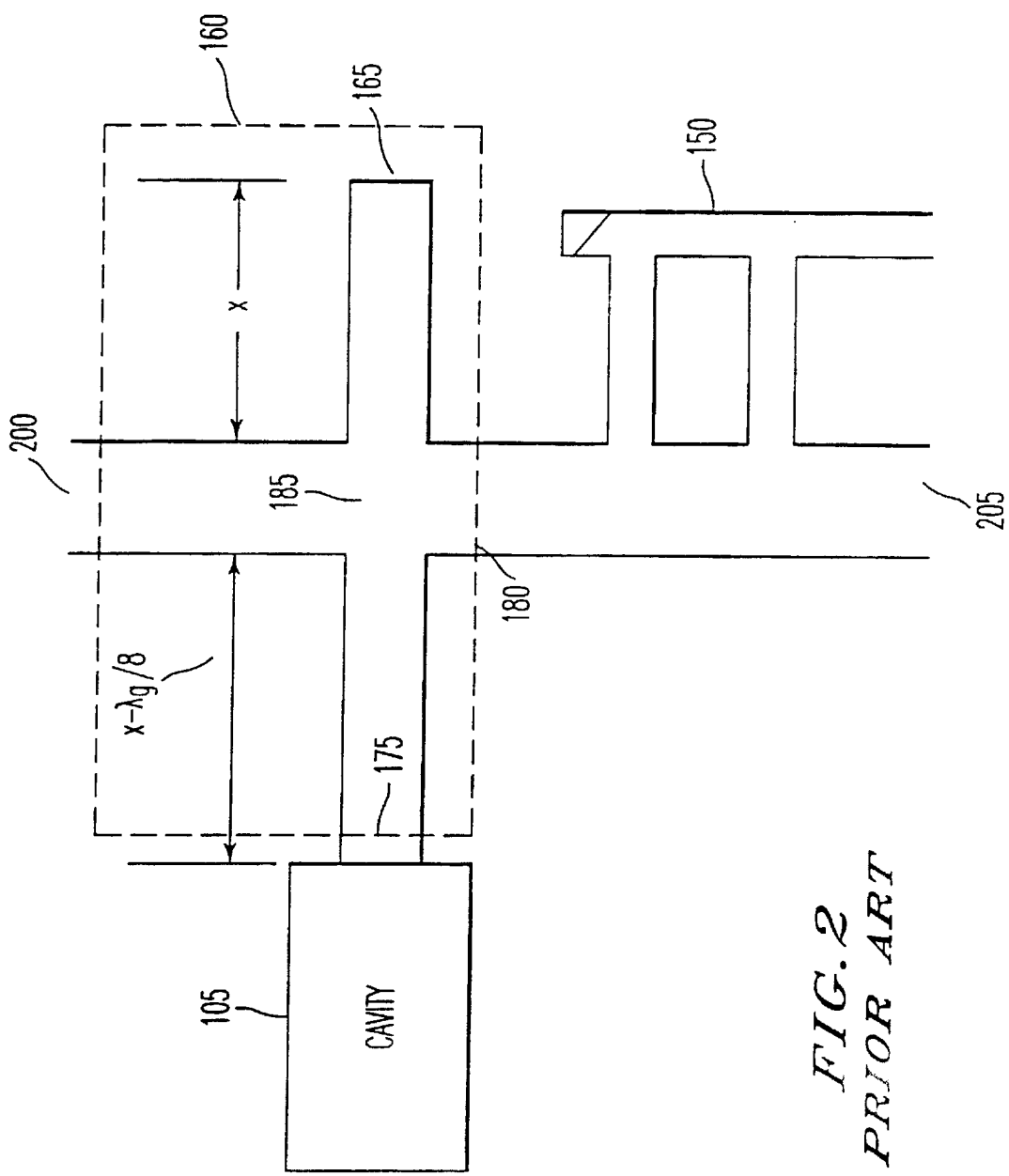
FIG. 2 is a schematic illustration of a known discriminator for use in the stabilization circuit of FIG. 1.
Figure 3:
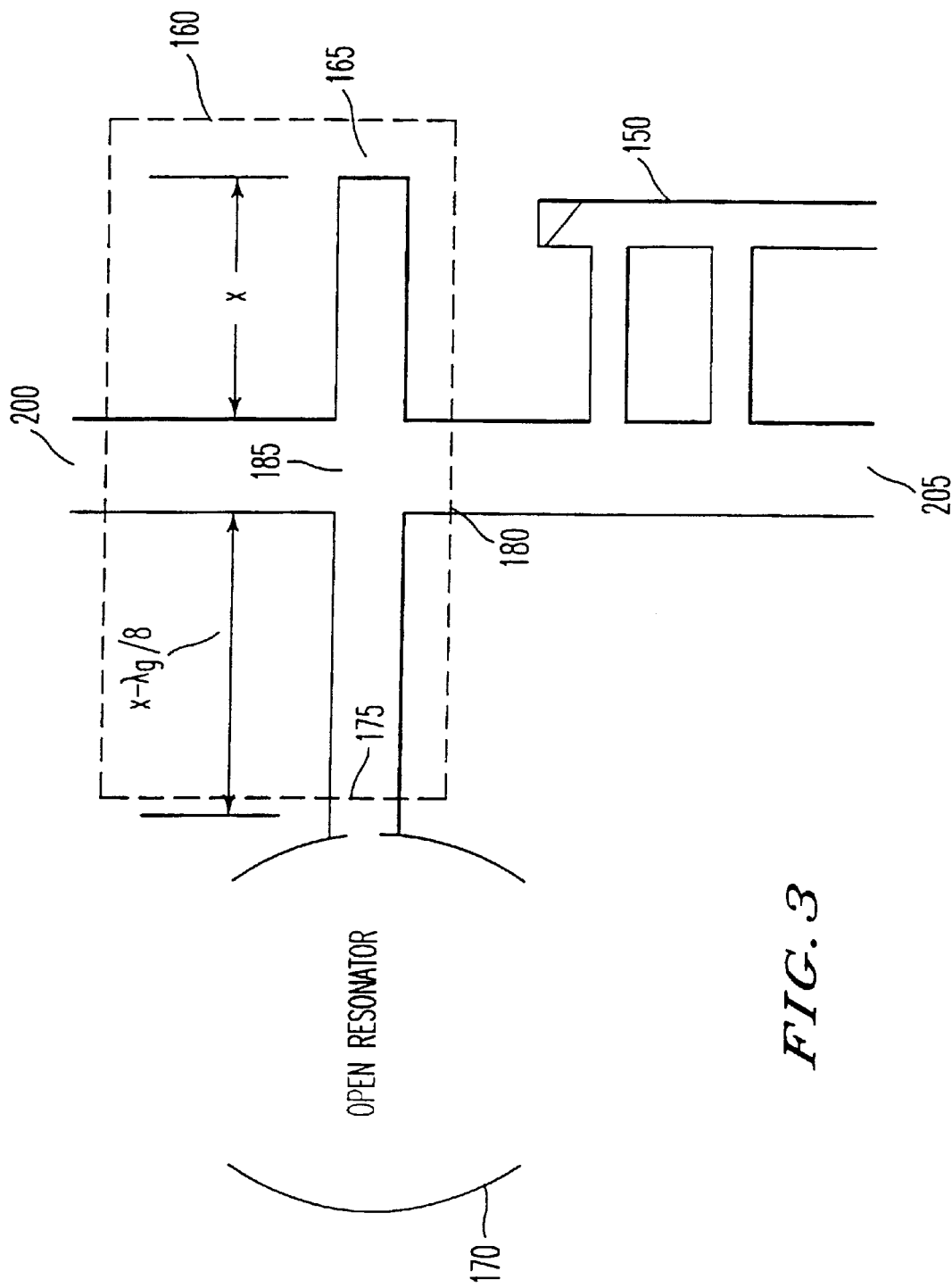
FIG. 3 is a schematic illustration of the discriminator of FIG. 2 being applied to an open resonator containing a plasma where the open resonator is acting as a stabilizing resonator.

Referring now to the drawings, in which like reference numerals designate identical or corresponding parts throughout the several views, FIG. 3 is a schematic illustration of the discriminator of FIG. 2 being applied to an open resonator containing a plasma where the open resonator is acting as a stabilizing resonator. Most of the elements of FIG. 3 are described above with reference to FIG. 2, and their description is not repeated here. However, having replaced the microwave cavity 105 of FIG. 2 with the open resonator 170 containing a plasma, the operation of the overall system is described hereinafter.

At frequencies far from one of its resonant frequencies, the resonator 170 reflects almost exactly as if there were a short-circuit at the plane of the coupling iris, i.e., the circular hole within the spherical mirror that acts as the interface between the line 175 and the resonator 170. As would be understood by one of ordinary skill in the art, the size and shape of the hole can be determined empirically. Moreover, the location of the coupling iris on the spherical mirror is such that it does not excite undesired resonant modes within the resonator 170. Consequently, at such frequencies the waves reflected back toward the junction 185 in the short-circuited waveguide 165 and the line 175 arrive Π/2 radians out of phase at the junction 185. Matched detectors (not shown) coupled to the terminals 200 and 205 will therefore give equal output voltages, and the difference between the voltages will be zero.

However, at the resonant frequency of the resonator 170, the admittance of the resonator 170 acts as if it were a pure conductance located at the plane of the coupling iris. The wave reflected from the resonator 170 combines with the wave reflected from the short-circuited waveguide 165 in such a way that waves of equal amplitude emerge from the Tee at terminals 200 and 205. The output of the detectors will once again be equal (though different from the values at frequencies far from resonance). For frequencies slightly removed from the resonant frequency, the admittance of the resonator 170 has a non-zero susceptance, which will be inductive for frequencies less than the resonant frequency and capacitive for frequencies greater than the resonant frequency. On one side of resonance, the detector coupled to terminal 205 receives more power and the detector coupled to terminal 200 receives less power; so the output voltages are unequal. Consequently the difference between them is non-zero. On the other side of resonance, the detector coupled to terminal 205 receives less power and the detector coupled to terminal 200 receives more power. The difference is again non-zero but has the opposite algebraic sign. A mathematical analysis is presented on page 64 of Montgomery. A representative output voltage from a discriminator 110 is shown in FIG. 4.

Figure 1:
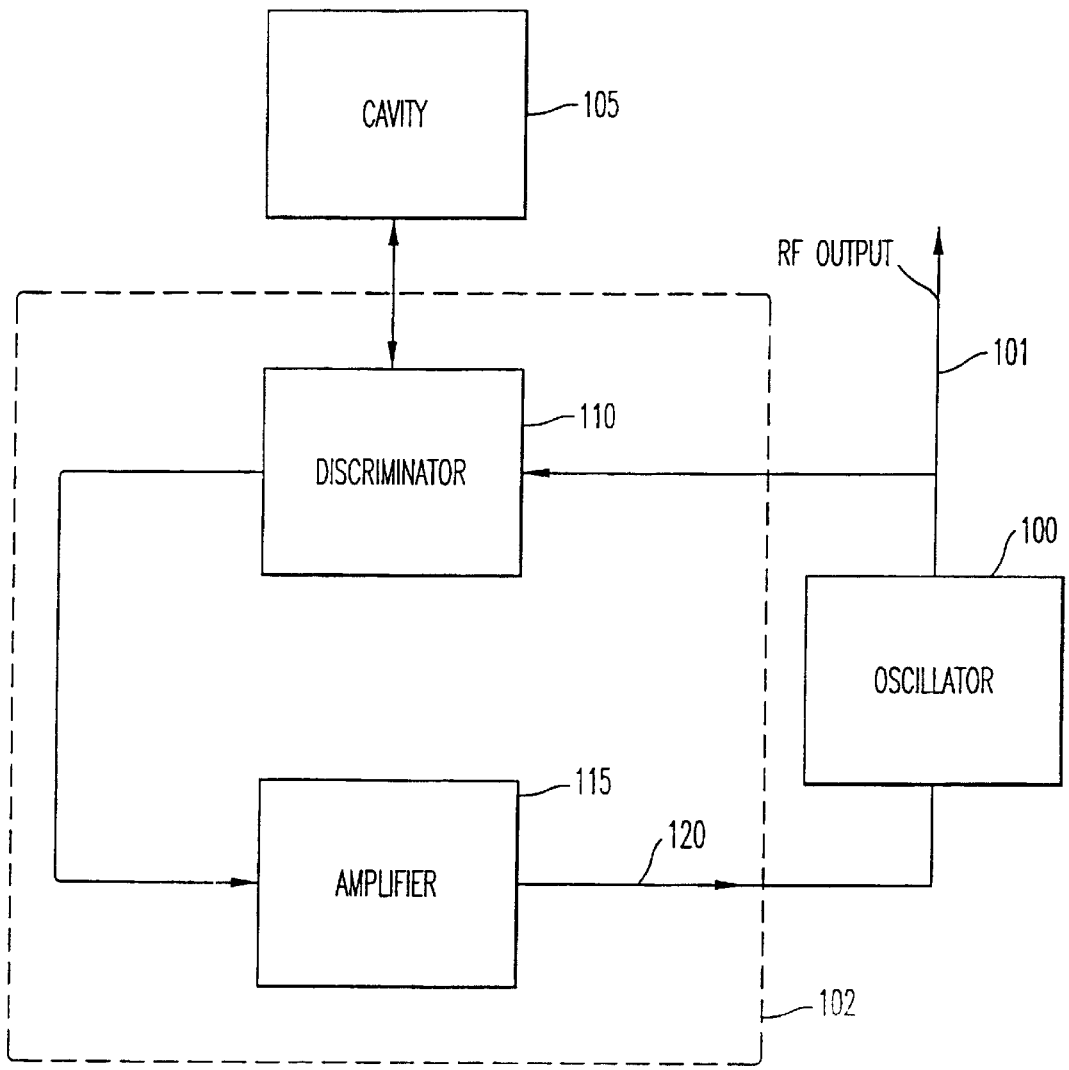
FIG. 1 is a block diagram of a known stabilization circuit for matching a frequency of a microwave cavity and a local oscillator.
Figure 4:
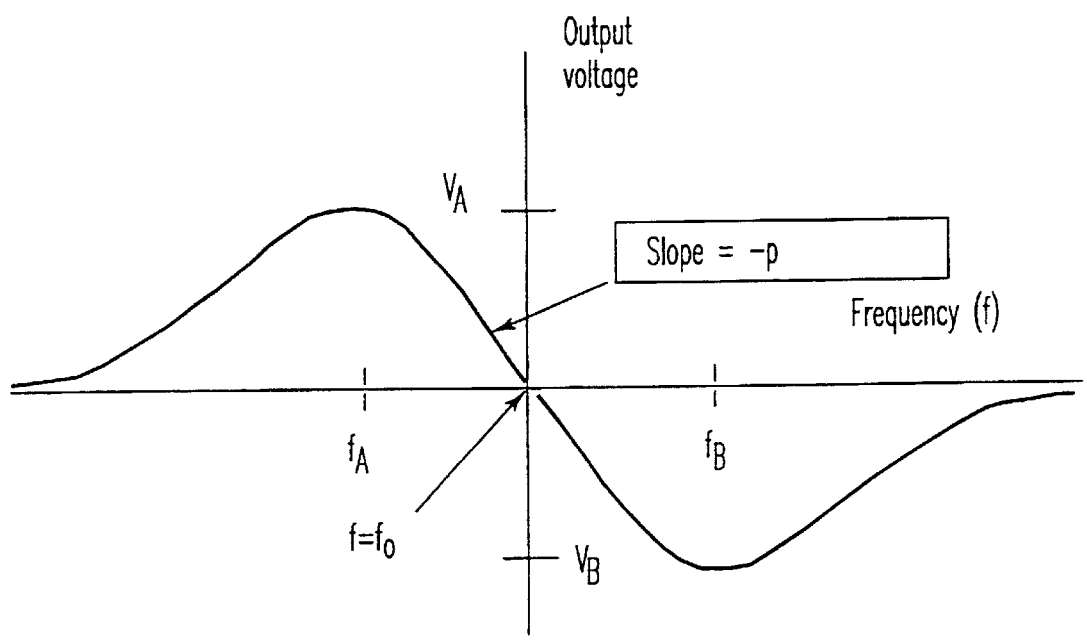
FIG. 4 is a graph of the output of the discriminator 110 based on a varying frequency.

Stabilization of the local oscillator is possible for frequencies between $f_A$ and $f_B$ that correspond approximately to the extreme $V_A$ and $V_B$ of the discriminator characteristic shown in FIG. 4. An analysis of the frequency control is described hereinafter. The slope of the output of the discriminator 110 between $f_A$ and $f_B$ can be approximated by $-p$, where p is a positive number with units of volts/hertz. When the oscillator 100 has a monotonic frequency tuning characteristic and the frequency increases as the voltage applied to the tuning input becomes more positive, then the tuning characteristic can be approximated by a straight line with a slope R, where R is a positive number with units of hertz/volt. In addition, the gain of the amplifier 115 shown in FIG. 1 is denoted hereinafter by G.

If the system is adjusted so that (1) the output voltage for the discriminator 110 is zero for the frequency $f_0$, as indicated in FIG. 4, (2) the oscillator 100 is locked to the resonant frequency of resonator 170 at $f_0$, and (3) the resonant frequency of the resonator 170 increases due to the introduction of a plasma, then the effect on the discriminator characteristic will be to translate it toward higher frequencies so that the zero crossing point moves from $f_0$ to a frequency $f_0' > f_0$. Consequently, the output of the discriminator 110 will be a positive voltage that will cause the frequency of the locked oscillator 100 to increase. After the system has stabilized, the output voltage of the discriminator 110 will be:

$$V_{disc} = p(f' - f_0'),$$

where f' is the oscillator frequency that results from the change in the cavity resonant frequency. It is noted that the frequency f' must be less than $f_o'$, otherwise there would be no correction voltage and the oscillator frequency would remain $f_0$. The amplified voltage is given by:

$$V_{amp} = GV_{disc} = Gp(f_0' - f').$$

The amplified voltage is responsible for the frequency change; so $V_{amp}$ also is written as:

$$V_{amp} = R(f' - f_0)$$

If the gain of the amplifier is so large that $R/pG \ll 1$, it follows that:

$$\frac{f' - f_0}{f_0' - f_0} = \frac{pG}{PG + R} \approx 1$$

which means that the change in the frequency of the locked (i.e., stabilized) oscillator frequency is virtually the same as the change in the resonant frequency of the resonator 170.

Figure 5:
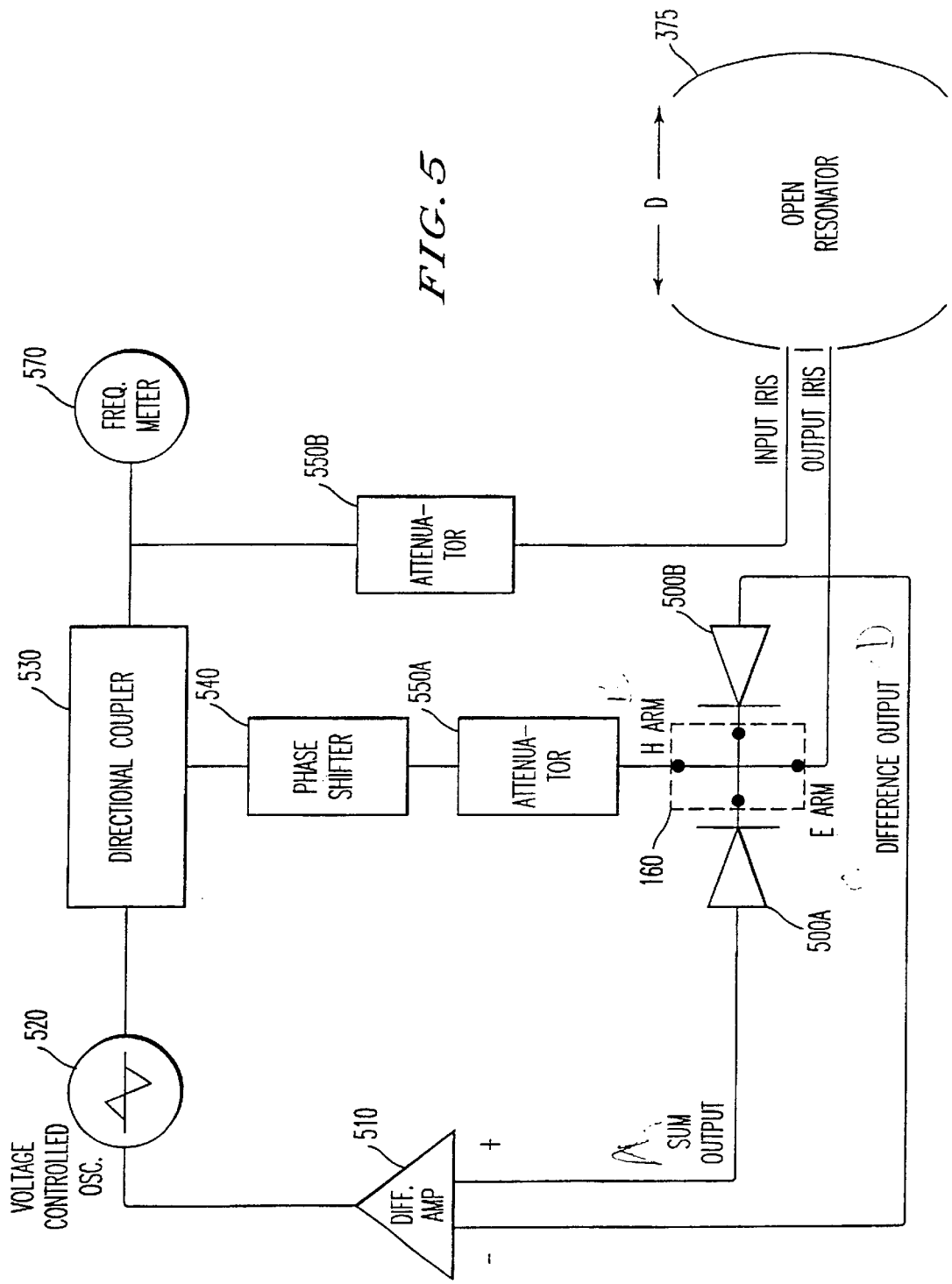
FIG. 5 is a diagram of an oscillator stabilization circuit according to the present invention.

FIG. 5 is a schematic illustration of an oscillator stabilization circuit using an open resonator as the frequency determining element. The elements connected to the open resonator 170 act as a microwave discriminator, similar to the microwave discriminator of FIG. 3. In this embodiment, the resonator has an output iris that is separate from the input iris and decoupled from it except when the frequency of the microwave signal corresponds to one of the resonant frequencies of the open resonator (i.e., within limits determined by the resonator Q). Although it is virtually impossible to guarantee that a coupling aperture will excite only the desired resonant mode, the diameter and radii of curvature of the mirrors, and the distance between the mirrors may be chosen to introduce a measure of mode degeneracy and thereby reduce the complications associated with the excitation of modes characterized by different resonant frequencies.

In one embodiment of the present invention, both the input and the output microwave connections to the open resonator are made to the same reflector. This is more convenient to build for the purposes envisioned here than a circuit in which the input microwave connection is on one reflector and the output microwave connection is on the other. There is, however, no significant difference in the electrical performance of the two configurations. Thus, in an alternate embodiment, the connections are made on opposite reflectors.

The discriminator configuration shown in FIG. 5 is superior to the discriminator shown in FIG. 3. In the discriminator of FIG. 3, the microwave signal reflected from the stabilizing resonator is large both on resonance and off resonance, unless the resonator coupling is close to critical. Practically, this means that tracking usually is performed with relatively small changes in large signals. With the transmission resonator of FIG. 5, the transmitted microwave signal is virtually zero off resonance and large on resonance; so the comparison is between a large signal on resonance and a small signal off resonance.

The structure of FIG. 5 is such that the open resonator 170 is coupled through the output iris to the bottom arm (the E arm) of a magic Tee 160. The input can be put on H or E. Depending on to which it is connected, the waveguide lengths would be adjusted to accommodate the alternate orientation of the magic Tee 160. Detectors 500A and 500B are connected on the left and right arms, respectively, of the magic Tee 160. The detectors 500A and 500B connect to the positive and negative inputs, respectively, of a difference amplifier 510. In one embodiment, the difference amplifier 510 is a direct coupled amplifier. In an alternate embodiment the difference amplifier 510 is an IF amplifier and is used as described in section 2–17 entitled "The I-F Stabilization System," of Montgomery. The output of the difference amp 510 acts as a frequency control voltage which is applied to a voltage controlled oscillator 520 (e.g., a 35 GHz voltage controlled oscillator). The output of the voltage controlled oscillator 520 is connected to a directional coupler 530 which couples the signal to a phase shifter 540. Having shifted the phase of the coupled signal, the phase shifter 540 applies the shifted signal to a first attenuator 550A, which produces a shifted, attenuated signal that is applied to the H arm of the magic Tee 160.

The action of the microwave bridge depends on the coherent addition of two microwave signals, one a reference signal and the other a signal transmitted from the open resonator after having passed through it, as shown in FIG. 5. In order for the microwave bridge to function properly, the electrical lengths of the reference and signal paths (i.e., the phase changes associated with the corresponding physical lengths) must be properly related and, ideally, this relationship should be virtually independent of frequency. Furthermore, it is important to recognize that the electrical lengths of the two paths are to be determined with respect to the physical locations of the reference planes of the magic Tee used in the bridge. If sufficient care is not exercised in this regard, the bridge output signal will not have the desired characteristic as a function of frequency, and the bridge will not function as desired. Although the circuit can be assembled only if the mechanical dimensions are properly related, it will perform properly only if the electrical lengths also are properly related.

In addition, spurious signals reflected back to the magic Tee by crystal detectors that are only slightly mismatched or from the output port of the open resonator are also a potential problem and may cause the actual bridge output characteristic to differ significantly from the desired shape. In one embodiment, isolators that are placed in the input arms of the magic Tee are used to mitigate this problem.

When the physical lengths of the reference and signal paths are short, the requirement that the phase difference associated with the two paths be essentially insensitive to frequency changes for frequencies of interest can often be satisfied without great difficulty. On the other hand, when some of the critical elements are necessarily long because of physical constraints, the problem is more difficult. In such cases, it is important to design the physical circuit in such a way that the required phase difference associated with the electrical lengths of the two paths is maintained to the greatest possible extent. For example, if the two paths in the circuit are to differ in length by a quarter of a wavelength (a phase difference of $\Pi/2$ radians or 90 degrees), it may be advisable to construct the two paths as similarly as possible with the exception of only the quarter wavelength difference, even if it is possible to make one branch significantly shorter than the other by an integral number of wavelengths at the design frequency. Although the latter choice would have no practical electrical consequence at the design frequency, the frequency dependence of the phase difference between the two paths would be greater than for paths of more nearly equal electrical lengths.

In one embodiment of a microwave bridge circuit, a phase shifter is used to create the required phase difference between the reference and signal paths. The system also includes an isolator in the signal path that permits transmission only in the direction from the open resonator toward the magic Tee. This eliminates the possibility of undesirable effects due to reflections originating at the magic Tee port in the signal path. A second isolator could be included in the reference signal path for the same reason. Two attenuators are included in the reference path to facilitate equalization of the amplitudes of the signals incident upon the magic Tee via the reference and signal paths.

Figure 9:
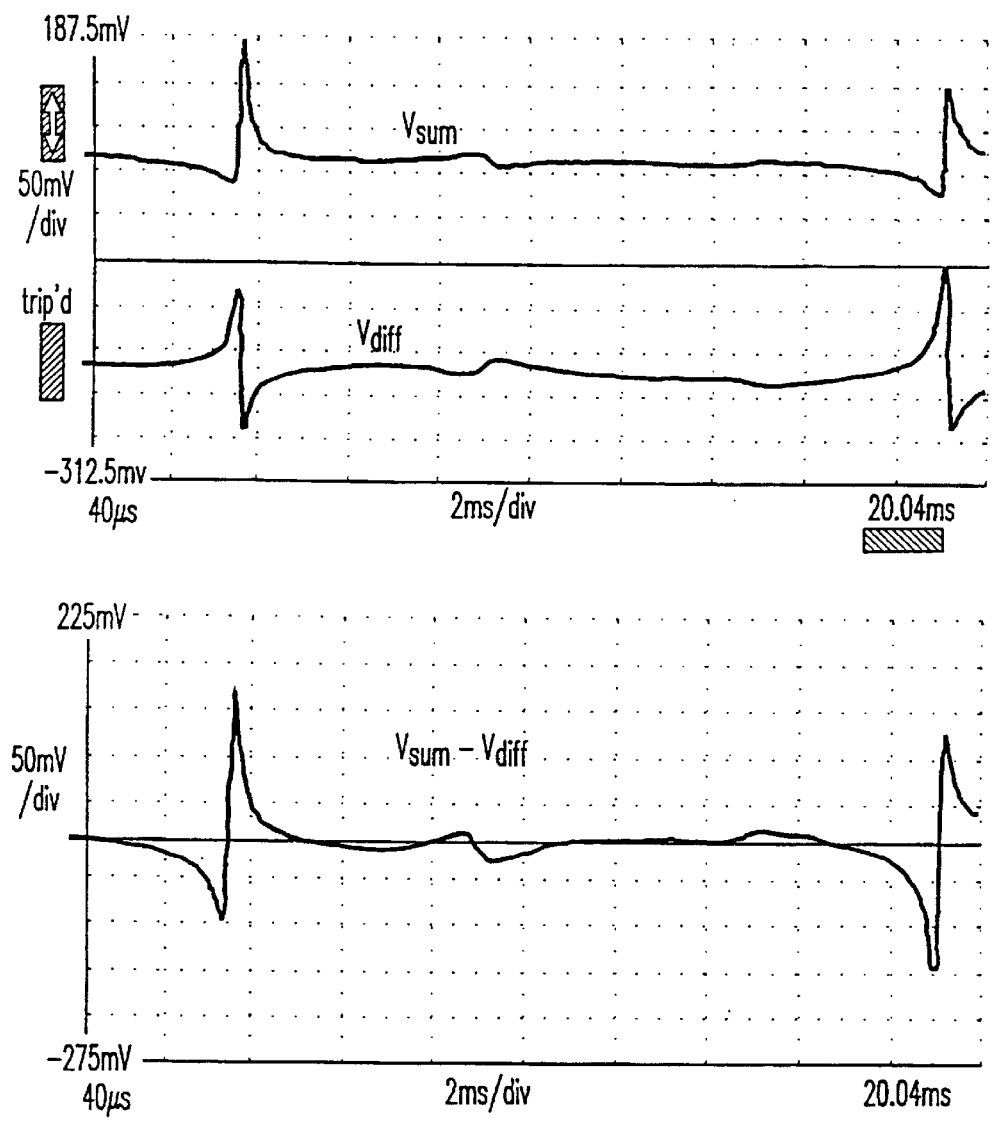
FIG. 9 shows oscilloscope traces obtained from a microwave bridge according to one embodiment of the present invention.

The oscilloscope traces of FIG. 9 illustrate signals obtained from the microwave bridge according to one embodiment of the present invention. The discriminator output is represented by the lower-most curve labeled $V_{sum}-V_{diff}$. The two large waveforms in that curve represent the discriminator output corresponding to desired open resonator modes. The smaller discriminator-like output between the two larger waveforms is thought to be due to the undesirable excitation of a so-called "off-axis" mode. In alternate embodiments, the mirror diameter is reduced, an absorbing aperture is added to the mirror, and/or the coupling aperture is placed at the exact center of the mirror to reduce the undesirable excitations.

The whole signal process, however, is controlled by coupling the output of the voltage controlled oscillator 520 to not only the phase shifter 540, but also to a second attenuator 550B and to a frequency meter 570. The attenuated output of the attenuator 550B is applied to the open resonator (containing a plasma), and the resulting interior fields are sampled using the output iris.

Figure 6:
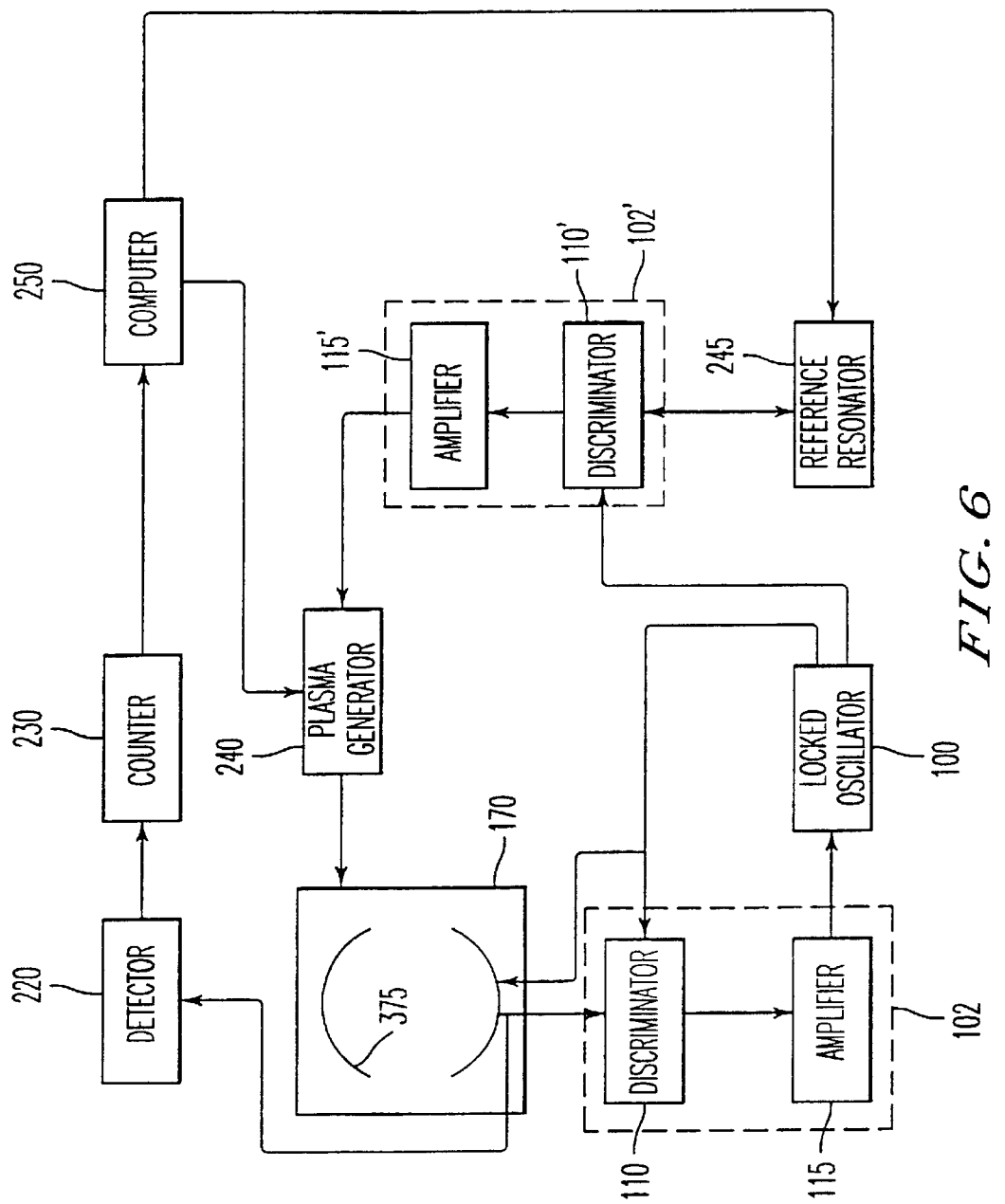
FIG. 6 is a block diagram of a first embodiment of a plasma generator control system according to the present invention.

FIG. 6 is a block diagram of a first embodiment of a plasma generator control system according to the present invention. To provide this control system, the following additional limitations need to be considered.

1. The frequency change of the locked oscillator will always be less than the change in the resonant frequency of the resonator, but the difference can be made quite small if the amplifier gain is sufficiently large. However, to prevent instability problems, the amplifier gain is selected to not be too great.
2. It is preferable that the oscillator be locked to (i.e., be stabilized by) the same resonator mode (i.e., resonance frequency) throughout the entire range of plasma electron densities of interest during a given operation. The control voltage for an appropriate oscillator 100 (e.g., a solid-state oscillator) is expected to have a range on the order of +/-5 volts for the frequency ranges described herein. This implies that the output of the amplifier should have a linear dynamic range on the order of +/-20 volts.
3. It is preferable that the oscillator 100 does not shift to a different resonator mode during a particular process, although it is not necessary to know the particular mode to which the oscillator 100 is locked. A mode shift will result in an easily identifiable change in the voltage applied to the tuning element of the oscillator 100. The tuning electrode voltage easily can be monitored by examining a voltage change applied to the oscillator 100.

The mode number need not be known because of the relationships among the resonant frequencies of an open resonator. For example, for a confocal resonator, the resonant frequencies are given by:

$$f(q, n) = \left(\frac{c}{2nd}\right)\left(q + \frac{1}{2}\right),$$

where n is the index of refraction of the medium in the resonator, c is the speed of light in a vacuum, d is the distance between the reflectors 175 (shown in FIG. 6), and q is the axial mode number. From this expression, it follows that:

$$\frac{f(q, 1)}{f(q, n)} = n,$$

which is independent of the axial mode number q, since n is unrelated to the mode number. However, q must have the same value in the numerator and denominator representing that the oscillator remains locked to the same mode throughout.

If the index of refraction is not uniform in the region between the reflectors, f(q,n) is replaced by f(q,<n>) where <n> is the mean index of refraction along a path between the two reflectors at the frequency of operation. Consequently $$\langle n \rangle \equiv \frac{1}{d}\int n dx \approx \frac{f(q, 1)}{f(q, \langle n \rangle)}$$

It is well known that the index of refraction and the plasma density N are related by the approximation given by:

$$n \approx \sqrt{1 - \frac{Ne^2}{\varepsilon_0 m(2\Pi f)^2}} = \sqrt{1 - \left(\frac{f_p}{f}\right)^2},$$

where e is the magnitude of the charge of an electron, m is the electron mass, $\varepsilon_o$ is the permittivity of free space, f is the signal frequency, and $f_p$ is the plasma frequency. If $$\left(\frac{f_p}{f}\right)^2 \ll 1,$$

it follows that:

$$n \approx 1 - \frac{e^2}{8\Pi^2 \varepsilon_0 m f^2} N,$$

and, consequently, that:

$$\int n\, dx \approx d - \frac{e^2}{8\Pi^2 \varepsilon_0 m f^2} \int N\, dx.$$

From the value obtained previously for $$\frac{1}{d} \int n\, dx,$$

it follows that:

$$\frac{1}{d} \int N\, dx \equiv \langle n \rangle \approx \frac{8\Pi^2 \varepsilon_0 m [f(q, \langle n \rangle)]^2}{e^2} \left[1 - \frac{f(q, 1)}{f(q, \langle n \rangle)}\right].$$

That expression provides an approximate value for the plasma density along a path between the reflectors in terms of the simple frequency measurements described above. Whereas a single measurement system provides a value for the mean plasma density along a path between the reflectors for that system, multiple systems, e.g., two or more, in the same process chamber provide, essentially simultaneously, additional information about the spatial variation of the plasma density. Rather than use two completely independent measurement systems, an alternative embodiment uses (1) the same measurement system external to the process chamber and (2) different sets of mirrors within the chamber that are connected to the measurement system external to the chamber. Still another embodiment provides moveable reflectors inside the process chamber using a controller exterior to the process chamber. Such movement is possible if non-rigid waveguides are used, within the process chamber.

The possibility that the microwave discriminator circuit might lose control of the oscillator frequency causes additional complications. If the oscillator frequency becomes unlocked, it is presumed that it will move from f(q,<n>), its value when control is lost, toward f(q,1). If this situation occurs, the electromagnetic field in the open resonator will decay until the oscillator frequency approaches f(q−1,<n>). At that point the electromagnetic field in the open resonator will increase and the frequency control circuit may regain control, stabilizing the oscillator frequency at f(q−1,<n>). If control is not regained at f(q−1,<n>), the decline in frequency will continue until the oscillator frequency approaches f(q−2,>n≦). It is presumed that this process will continue until the oscillator frequency once again becomes locked at a resonant frequency f(q−w,<n>), where w is an integer that is expected to be in the range from 1 to 3.

In order to interpret the experimental data obtained from this system, the integer, w, must be known. To determine w, a small amount of power is coupled from the open resonator 170 and fed to a detector 220 (e.g., a crystal detector) and a counter 230 as shown in FIG. 6. If the field in the open resonator 170 collapses due to the loss of control of the oscillator frequency, the output of the detector 220 will go to zero, and the counter 230 will record 1 event. For example, if the oscillator 100 slips from control at f(q,<n>), and its frequency is recaptured at f(q−1,<n>), the counter 230 will record 1 event. If control is not regained until f(q−2,<n>), the counter 230 will record 2 events. Control will not have been reestablished if the output of the detector 220 is zero.

Suppose that a temporary loss of frequency control leads to a change from mode q to mode q−w. In such a case the mean index of refraction <n> can be expressed as:

$$\langle n \rangle = \frac{f(q-w, 1)}{f(q-w, \langle n \rangle)}.$$

For an empty confocal resonator it is well known that f(q−w,1) can be expressed as:

$$f(q-w, 1) = f(q, 1) - w\left(\frac{c}{2d}\right).$$

Consequently, $$\langle n \rangle = \frac{f(q, 1) - w(c/2d)}{f(q-w, \langle n \rangle)}$$

Since all the information necessary for determining <n> is known, the system (and method) of the present invention can be used to generate a control voltage, thereby controlling the plasma generator 240 (with or without using shaping of the control voltage signal). As shown in the embodiment of FIG. 6, the plasma generator 240 is controlled using a second frequency discriminator 110'. This second discriminator 110' compares the frequency of the oscillator 100 to the resonant frequency of a plasma generator reference resonator 245 (e.g., a frequency meter) which has been set using a computer to the desired locked oscillator frequency, which is given by:

$$f_{OSC} = \frac{f(q-w, 1)}{\langle n_d \rangle},$$

where $<n_d>$ is the desired mean index of refraction for the process. For the preferred mode of operation in which the oscillator 100 remains locked to the same resonant mode during the entire process, w=0. However, for the sake of generality, it is assumed that the frequency of the oscillator 100 initially is locked on the frequency of mode q, and subsequently is locked on the frequency of mode q−w. As discussed above, w is assumed to be known.

The second discriminator 110' acts as a plasma generator control discriminator and has an output which has a characteristic similar to the one shown in FIG. 4. The discriminator 110' can be selected so that it has a positive voltage for f(q−w,<n>)<$f_{osc}$, a negative voltage for f(q−w,<n>)>$f_{osc}$, and zero for f(q−w,<n>)=$f_{osc}$.

According to the present invention, the system may be controlled as follows:

1. With the power of the plasma generator 240 off, adjust the discriminator 110, amplifier 105, and oscillator 100 so the oscillator 100 is locked to a convenient mode of the open resonator.
2. Calculate the frequency of the oscillator 100 corresponding to $<n_d>$, the desired value of $<n>$.
3. With the plasma generator control circuit 102' disengaged, set the plasma generator control resonator 245 to the frequency calculated in step 2 above.
4. Energize (1) the computer 250, (2) the control circuit elements, and the plasma generator 240.
5. Monitor the output voltage of the plasma generator control amplifier 115' to verify that the entire control system is functioning properly.

Figure 7:
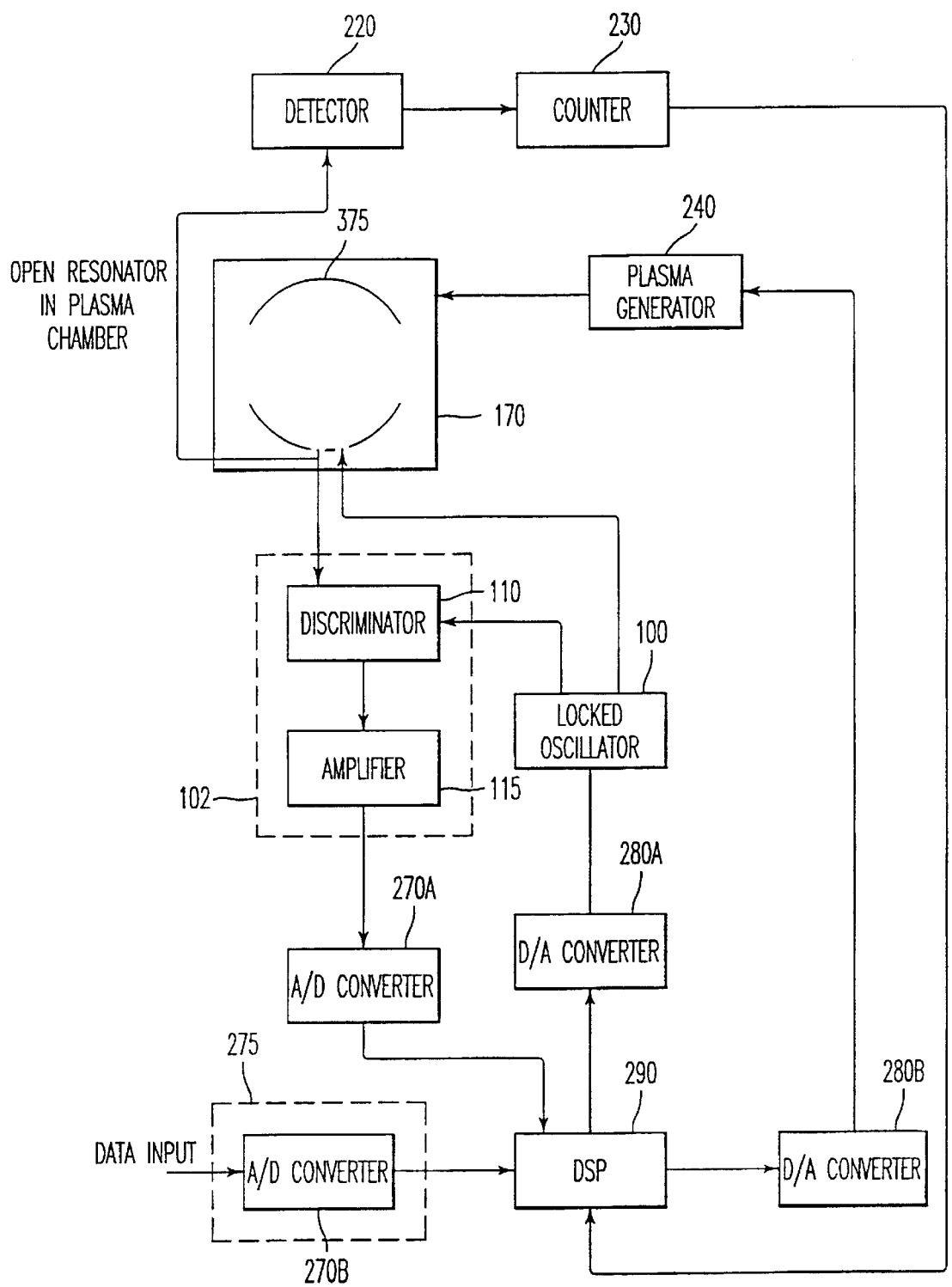
FIG. 7 is a block diagram of a second embodiment of a plasma generator control system using a digital signal processor according to the present invention.

In an alternate embodiment of the present invention shown in FIG. 7, a portion of the embodiment of FIG. 6 is replaced by a Digital Signal Processor (DSP) 290 and support circuitry. Specifically, (1) the computer, (2) the second stabilizer 102', and (3) the plasma generator reference resonator 245 are replaced by (1) the DSP 290, (2) at least one AND convertor (e.g., 270A), and (3) two D/A convertors (280A and 280B). The DSP 290 responds to three inputs: (1) the oscillator control voltage for the oscillator frequency that corresponds to the desired plasma density, entered through the data input device 275 (e.g., via a keyboard or via a potentiometer through the A/D converter 270B); (2) the digital equivalent of the voltage of stabilizer circuit 102 having been converted by A/D converter 270A; and (3) the output of a counter 230 fed by the detector 220 connected to the output line of the open resonator 170.

If the electromagnetic field in the open resonator 170 collapses due to the loss of control of the oscillator frequency, the output of the detector 220 in the output line of the open resonator 170 will drop to zero, and the counter 230 will record the event. Loss of lock can be used to inform the DSP 290 to initiate an algorithm to reestablish lock as described below and/or to alert an equipment operator to loss of lock and the possibility of an equipment malfunction. It is noted that a zero output from the detector 220 implies that the oscillator frequency is not locked to a resonant frequency of the open resonator 170.

One output of the DSP 290 is converted by a D/A convertor 280A to an analog signal which is then used as the control voltage for the oscillator 100. A second output of the DSP 290 is converted by a second D/A converter 280B to an analog signal that is used to control the plasma generator 240.

A change in the plasma generator control voltage causes the plasma density to change, which in turn causes the outputs of the discriminator 110, the discriminator amplifier 115, and the A/D converter 270A to change. The DSP 290 responds by changing the control voltage via the D/A convertor 280A, and, therefore, the frequency of the oscillator 100 also changes. The updated value of the oscillator control voltage is a measure of the updated plasma density. The DSP 290 compares the digital equivalent of the voltage being supplied to the control terminal of the oscillator 100 to the data entered via the input device 275 and sends an appropriate control signal to the plasma generator 240 through the D/A converter 280B. The output of the locked oscillator 100 is then applied to the plasma chamber.

The sampling period of the system is chosen to ensure that an out-of-lock condition will be recognized by the DSP 290. The DSP 290 may then employ various algorithms to reestablish the lock between the oscillator frequency and the open resonator resonant frequency. A first such algorithm calculates an expected plasma density based on one or more measured parameters, such as radio frequency (RF) power, gas pressure, gas flow rate, chamber temperature, and plasma optical signature. The DSP 290 then searches for a discriminator zero within calculated frequency limits. A second such algorithm measures the intermodal spacing to determine an approximate plasma density and then conducts a search for a discriminator zero at the determined density.

Figure 8:
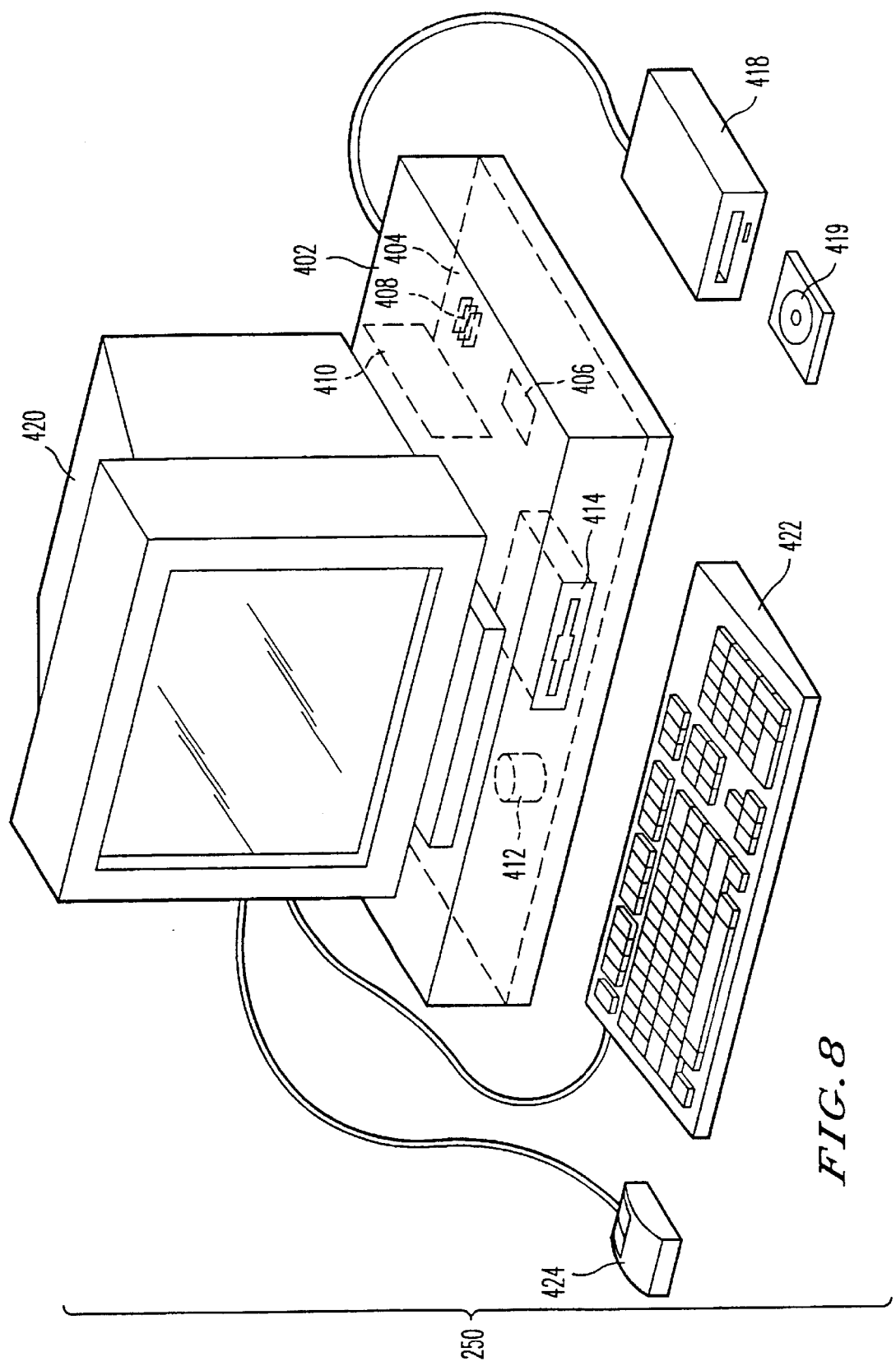
FIG. 8 is a block diagram of a computer for implementing a portion of the control system according to the present invention.

FIG. 8 is a schematic illustration of an embodiment of the computer 250 shown in FIG. 6 for controlling a plasma generator 240. The computer 250 includes a computer housing 402 which contains a motherboard 404 which contains a CPU 406, memory 408 (e.g., DRAM, ROM, EPROM, EEPROM, SRAM, SDRAM, and Flash RAM), and other optional special purpose logic devices (e.g., ASICs) or configurable logic devices (e.g., GAL and reprogrammable FPGA). The computer 250 also includes plural input devices, (e.g., a keyboard 422 and mouse 424), and a display card 410 for controlling monitor 420. In addition, the computer system 250 further includes a floppy disk drive 414; other removable media devices (e.g., compact disc 419, tape, and removable magneto-optical media (not shown)); and a hard disk 412, or other fixed, high density media drives, connected using an appropriate device bus (e.g., a SCSI bus, an Enhanced IDE bus, Ultra DMA bus). Also connected to the same device bus or another device bus, the computer 250 may additionally include a compact disc reader 418, a compact disc reader/writer unit (not shown) or a compact disc jukebox (not shown). Although compact disc 419 is shown in a CD caddy, the compact disc 419 can be inserted directly into CD-ROM drives which do not require caddies. In addition, a printer (not shown) also provides printed listings of how well the frequencies of the oscillator 100 and the resonance resonator 170 match.

As stated above, the system includes at least one computer readable medium. Examples of computer readable media are compact discs 419, hard disks 412, floppy disks, tape, magneto-optical disks, PROMs (EPROM, EEPROM, Flash EPROM), DRAM, SRAM, SDRAM, etc. Stored on any one or on a combination of computer readable media, the present invention includes software for controlling both the hardware of the computer 250 and for enabling the computer 250 to interact with a human user. Such software may include, but is not limited to, device drivers, operating systems and user applications, such as development tools. Such computer readable media further include the computer program product of the present invention for controlling a plasma generator 240. The computer code devices of the present invention can be any interpreted or executable code mechanism, including but not limited to scripts, interpreters, dynamic link libraries, Java classes, and complete executable programs. Moreover, previously described as a separate DSP 290, the computer 250 may actually replace the DSP by being programmed to perform the functions described above. The computer 250 additionally may control more than one process at a time without departing from the spirit of the invention.

Obviously, numerous modifications and variations of the present invention are possible in light of the above teachings. It is therefore to be understood that, within the scope of the appended claims, the invention may be practiced otherwise than as specifically described herein.

What is claimed is:

1. A system for controlling a plasma generator, the system comprising:
    an open microwave resonator resonating at a resonant frequency;
    an oscillator with an output having a variable frequency;

a control circuit for measuring a difference between the resonant frequency and the variable frequency and for applying a correction signal to the oscillator to change the variable frequency to substantially match the resonant frequency.

2. The system as claimed in claim 1, wherein the control circuit comprises a discriminator for measuring a frequency corresponding to a plasma density in a range from $10^{10}$ to $10^{12}$ cm$^{-3}$.

3. The system as claimed in claim 1, wherein the control circuit comprises a discriminator for measuring a frequency corresponding to an electron density in a range from $10^{10}$ to $10^{12}$ cm$^{-3}$.

4. The system as claimed in claim 1, wherein the open resonator is immersed in a plasma.

5. The system as claimed in claim 1, wherein the open resonator further comprises a reflector for accepting input and output microwave connections.

6. The system as claimed in claim 1, wherein the control circuit comprises:

a microwave frequency discriminator; and an amplifier connected to the microwave frequency discriminator, wherein the amplifier outputs the correction signal.

7. The system as claimed in claim 1, wherein the control circuit comprises:

a plasma generator reference resonator; and a microwave frequency discriminator for comparing a resonant frequency of the plasma generator reference resonator to produce the correction signal.

8. The system as claimed in claim 7, wherein the control circuit further comprises a computer for processing the correction signal before applying the control signal to the plasma generator.

9. The system as claimed in claim 7, wherein the control circuit further comprises a digital signal processor for comparing an output of the microwave discriminator with input data to control the plasma generator.

10. The system as claimed in claim 1, wherein the open resonator further comprises plural sets of reflectors for accepting plural, independent controllable sets of input and output microwave connections.

* * * * *